United States Patent [19]
Hsu

[11] Patent Number: 6,088,518
[45] Date of Patent: Jul. 11, 2000

[54] METHOD AND SYSTEM FOR PORTING AN INTEGRATED CIRCUIT LAYOUT FROM A REFERENCE PROCESS TO A TARGET PROCESS

[75] Inventor: Benjamin Jiann Hsu, San Jose, Calif.

[73] Assignee: Aspec Technology, Inc., Sunnyvale, Calif.

[21] Appl. No.: 09/016,762

[22] Filed: Jan. 30, 1998

[51] Int. Cl.⁷ ..................................................... G06F 17/50
[52] U.S. Cl. ................................ 395/500.04; 395/500.09
[58] Field of Search ..................... 364/488–491; 395/500, 500.02–500.19

[56] References Cited

U.S. PATENT DOCUMENTS

| | | | |
|---|---|---|---|
| 5,351,197 | 9/1994 | Upton et al. ........................ | 395/500.11 |
| 5,477,467 | 12/1995 | Rugg .................................. | 395/500.18 |
| 5,625,568 | 4/1997 | Edwards et al. .................... | 395/500.03 |
| 5,636,132 | 6/1997 | Kamdar .............................. | 395/500.03 |
| 5,754,826 | 5/1998 | Gamal et al. ....................... | 395/500.35 |
| 5,920,486 | 7/1999 | Beahm et al. ............................. | 716/10 |
| 5,936,868 | 8/1999 | Hall .................................... | 395/500.09 |

OTHER PUBLICATIONS

Lakos ("Technology retargeting for IC layout", 1997 Proceedings of 34th DAC Design Automation Conference, Jan. 1, 1997, pp. 1–6).

Rossum ("A user's perspective on IC retargeting", Electronic Engineering Times, No. 846, May 2, 1995, pp. 1–4).

*Primary Examiner*—Kevin J. Teska
*Assistant Examiner*—Phallaka Kik
*Attorney, Agent, or Firm*—Sawyer & Associates

[57] ABSTRACT

The present invention provides a method and system for porting an integrated circuit layout from a reference process to a target process. The method and system comprises placing components related to the reference process on a grid, wherein the grid is determined by equations that are based upon the desired layout architecture. The method and system includes utilizing the design rules of the target process along with the equations to determine the grid of the target process. The component layout is controlled by parameters, where the design rules provide the values of the parameters. Thus, each component will be properly ported when the parameter values are changed to that of the target process. Finally, the locations of the components are mapped grid-point to grid-point from the reference process to the target process. In so doing, an integrated circuit layout in the target process is drawn without design rule violation.

12 Claims, 3 Drawing Sheets

200

METHOD AND SYSTEM FOR PORTING AN INTEGRATED CIRCUIT LAYOUT FROM A REFERENCE PROCESS TO A TARGET PROCESS

FIELD OF THE INVENTION

The present invention relates generally to a system for creating and porting integrated circuit layout and more particularly relates to a system and method for porting an integrated circuit layout from a reference process to a target process.

BACKGROUND OF THE INVENTION

Normally an integrated circuit layout is performed by drawing polygons which is a time consuming process that must be repeated for each process. In this type of layout system components consisting of polygons are placed in a pattern. This pattern will represent a circuit. In order to represent a circuit, polygons on several different layers are used. The types of layers include active, poly, contact and metal layers. By placing these layers next to each other or on top of each other, a circuit layout can be achieved.

In an integrated circuit layout there are a variety of ways in which the transistors and wiring can be arranged. A particular style of integrated circuit layout can be called an architecture. FIG. 1 illustrates an example of an architecture 10 is placing transistors parallel to each other.

The above-identified process is adequate for creating integrated circuit layout utilizing a particular process. However, this type of layout is not easily ported from a reference process to a target process. Known tools to migrate an integrated circuit layout from a reference process to a target process do not preserve the general topology of the cell. This is especially important when the cells are used in an automatic place and route flow. What is needed is a system and method for porting an integrated circuit layout from a reference process to a target process. The system must be easily implemented, cost effective and easily adaptable to existing systems.

The present invention addresses such a need.

SUMMARY OF THE INVENTION

The present invention provides a method and system for porting an integrated circuit layout from a reference process to a target process. The method and system comprises placing components related to the reference process on a grid, wherein the grid is determined by equations that are based upon the architecture of the layout desired. The design rules provide the values for the variables in the equations. When the values from the target process are plugged into these equations, the grid spacing for the target process is calculated. The components of the target layout are also drawn according to the design rule. The reference integrated circuit layout defines the arrangement of components placed in the grid of the reference process. During mapping the same arrangement is used, however the components are placed on the grid of the target process.

DETAILED DESCRIPTION OF THE INVENTION

The present invention relates to a method and system for porting an integrated circuit layout. The following description is presented to enable one of ordinary skill in the art to make and use the invention and is provided in the context of a patent application and its requirements. Various modifications to the preferred embodiment will be readily apparent to those skilled in the art and the generic principles herein may be applied to other embodiments. Thus, the present invention is not intended to be limited to the embodiment shown but is to be accorded the widest scope consistent with the principles and features described herein.

In a method and system in accordance with the present invention, the components of the reference process are placed according to a grid. Each component is preferably placed at a gridpoint. The grid spacing, in both X and Y directions, are determined by equations with the process within design rules as the variables. Thus the grid spacing will vary from process to process. The equations are set up so that a variety of patterns of components can be allowed without the creation of a design rule violation. The permitted patterns must be adhered to otherwise design rule violations will occur.

The process of porting is achieved by creating a layout or reference library based on a particular set of design rules. Thereafter the components can be drawn design rule correct from a target process to a reference process. To more particularly describe the features of the present invention, refer now to the following discussion in conjunction with the accompanying figures. The reference library will in accordance with the present invention have its own X and Y grid spacing. For an architecture to be supported in this methodology, a grid needs to be created that supports the architecture. If the grid system is to allow one transistor to be placed on each grid then the equation for the grid spacing would be:

$$\text{Minimum Poly Width} + \text{Minimum Poly Spacing}$$

Thus, in this example, the grid spacing must be at least that distance apart. A typical cell architecture is much more complex than this, so there would be several equations involving several design rules that would determine the grid spacing. The X and Y grid spacing can then be calculated for a target process. Preferably a software program is created which can map the location of the components grid point by grid point from the reference process to the target process.

Figure 1:
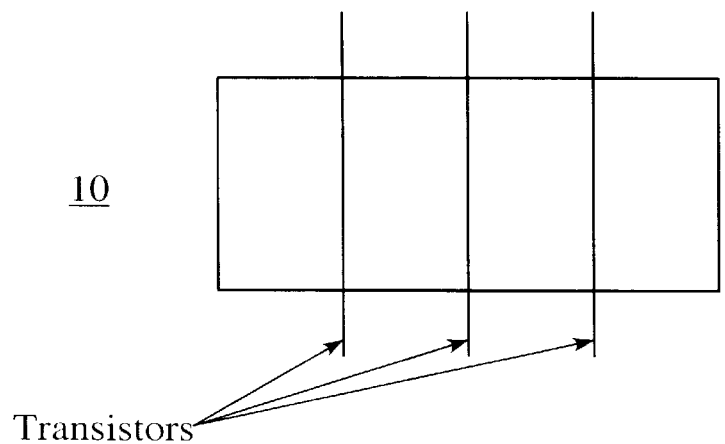
FIG. 1 illustrates an example of such a layout.
Figure 2:
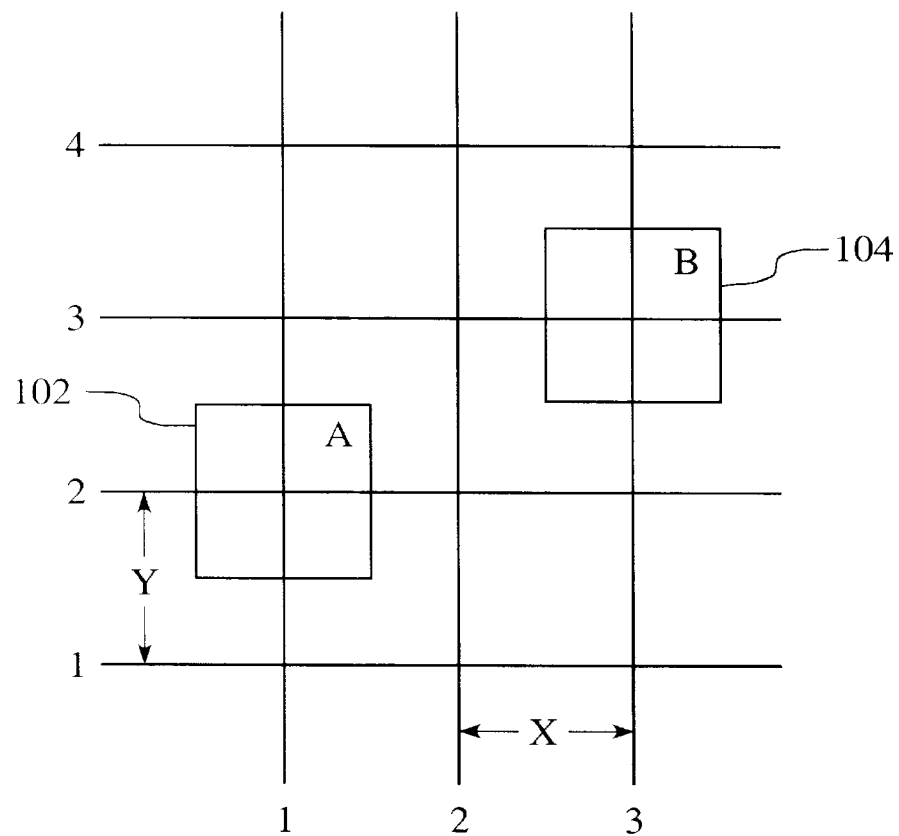
FIG. 2 is an illustration of a grid for a reference process.
Figure 3:
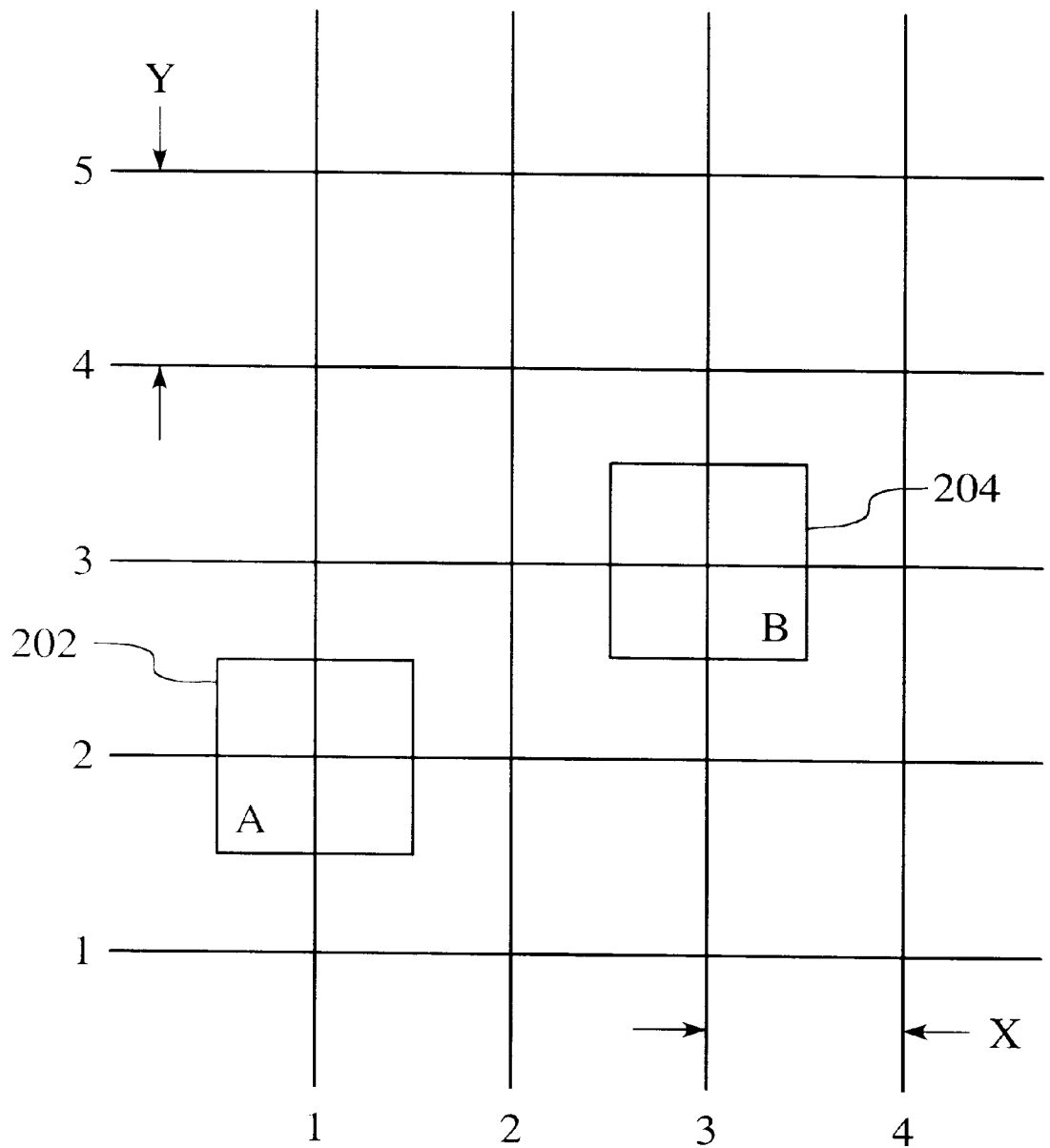
FIG. 3 is an illustration of a grid for a target process.

This is illustrated by the examples shown in FIGS. 2 and 3. FIG. 2 is an illustration of a grid 100 of a reference process. FIG. 3 is an illustration of a grid 200 of a target process.

In this embodiment, each component 102, 104, 202, and 204 in the reference and target processes of FIGS. 2 and 3, respectively, is either a transistor, a contact, or a routing element. As is seen the components 202 and 204 of target process (FIG. 3) are smaller than the corresponding components 102 and 104 of reference process (FIG. 2). One of ordinary skill in the art readily recognizes, however, that the components 202 and 204 of the target process could be larger than the components 102 and 104 of the reference process and they would still be within the spirit and scope of the present invention.

The manner that each one of these components can be drawn is governed by design rules of the particular process. Typically, each component is drawn with polygons whose vertices are determined by equations that use the design rules as variables.

For example, a contact component will consist of a contact and a metal square which overlaps the contact appropriately. Typically the design rules will state that the contact must be a minimum dimension and the overlap will be a minimum dimension.

Figure 4:
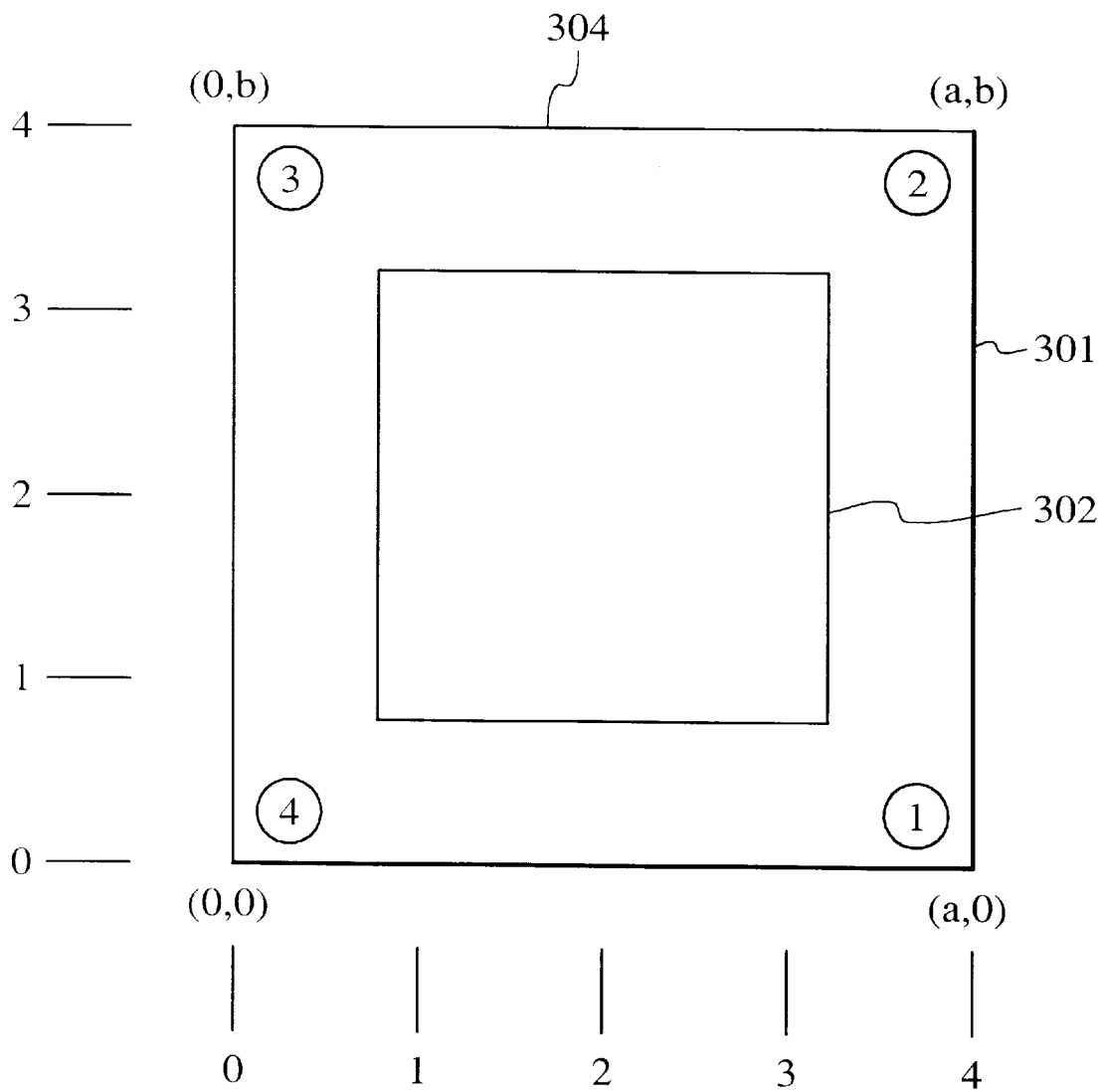
FIG. 4 illustrates a metal contact in which the minimum contact dimension (MC) is two (2) and the minimum metal overlap (MO) is one (1).

FIG. 4 illustrates, for example, a metal contact component 300 in which the minimum contact 302 dimension (MC) is two (2) and the minimum metal overlap 304 (MO) is one (1). Accordingly, the Points 0÷3 would have the following grid spacing (i.e., X,Y coordinates) for the reference process:

Point 0 is at (0,0)÷(0,0)

Point 1 is at (2 MO+MC,0)÷(4,0)

Point 2 is at (2 MO+MC, 2 MO+MC)÷(4,4)

Point 3 is at (0,2 MO+MC)÷(0,4)

Assuming that the target process has a MC of 1.5 and an MO of 1, to convert from the reference process to the target process the corresponding Points 0–3 for target process would produce the following grid spacing:

Point 0 is at (0,0)÷(0,0)

Point 1 is at (2MO +MC,0)÷(3.5,0)

Point 2 is at (2MO+MC, 2 MO+MC)÷(3.5,3.5)

Point 3 is at (0,2MO+MC)÷(0,3.5)

Accordingly the above-noted example illustrates that components can be converted design rule correct from a reference process to a target process. Accordingly, the present invention provides a method and system for porting an integrated circuit layout from a reference process to a target process. The method and system comprises placing components related to the reference process on a grid, wherein the grid is determined by equations that are based upon the design rules of the reference process and providing the grid of the components to the target process. The method and system includes utilizing the design rules of the target process along with the grid to map the components of target process to the grid based upon the equations.

In so doing, the components associated with the target process are drawn on an integrated circuit layout without design rule violations. Since the mapping is done gridpoint to gridpoint, the general topology of the layout is preserved. More specifically, pins that are placed on the grid in the reference process will be on grid in the target process. This becomes especially useful when the integrated circuit layouts are used in conjunction with an automatic place and route tool.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A method for porting an integrated circuit layout from a reference process to a target process comprising the steps of:
   (a) placing components related to the reference process on a grid, wherein the grid is determined by equations that are based upon the architecture of the layout;
   (b) determining a grid for the target process using the equations with target process design rules wherein step (b) further comprises:
      (b1) providing a minimum dimension of the components for the reference process;
      (b2) providing a minimum overlap of the components for the reference process;
      (b3) converting the minimum dimension and the minimum overlap for the reference process to minimum dimension and minimum overlap for the target process based upon design rules of the target process; and
   (c) mapping the location of the components on the grid of the target process gridpoint to gridpoint from the reference process to the target process.

2. The method of claim 1 in which placing step (a) comprises creating a reference library which includes a grid.

3. The method of claim 1 in which the components comprise a plurality of transistors.

4. The method of claim 1 in which the components comprise a plurality of contacts.

5. The method of claim 1 in which the components comprise a plurality of routing elements.

6. The method of claim 1 in which the components comprise a plurality of transistors, a plurality of contacts and a plurality of routing elements.

7. A system for porting an integrated circuit layout from a reference process to a target process comprising:
   means for placing components related to the reference process on a grid, wherein the grid is determined by equations that are based upon the architecture of the layout;
   means for determining a grid for the target process using the equations with target process design rules the determining means comprising:
   means for providing a minimum dimension of the components for the reference process;
   means for providing a minimum overlap of the components for the reference process;
   means for converting the minimum dimension and the minimum overlap for the reference process to minimum dimension and minimum overlap for the target process based upon design rules of the target process; and
   means for mapping the location of the components on the grid of the target process gridpoint to gridpoint from the reference process to the target process.

8. The system of claim, 7 in which placing means comprises creating a reference library which includes a grid.

9. The system of claim 7 in which the components comprise a plurality of transistors.

10. The system of claim 7 in which the components comprise a plurality of contacts.

11. The system of claim 7 in which the components comprise a plurality of routing elements.

12. The system of claim 7 in which the components comprise a plurality of transistors, a plurality of contacts and a plurality of routing elements.

* * * * *